United States Patent
Chen

(10) Patent No.: US 12,424,588 B2
(45) Date of Patent: Sep. 23, 2025

(54) METHOD AND APPARATUS FOR TRIMMING MICRO ELECTRONIC ELEMENT

(71) Applicant: PlayNitride Display Co., Ltd., MiaoLi County (TW)

(72) Inventor: Yen-Mu Chen, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 521 days.

(21) Appl. No.: 17/950,106

(22) Filed: Sep. 22, 2022

(65) Prior Publication Data

US 2024/0071992 A1  Feb. 29, 2024

(30) Foreign Application Priority Data

Aug. 29, 2022 (TW) .................................. 111132413

(51) Int. Cl.
*H01L 23/00* (2006.01)
*B23K 1/005* (2006.01)
(Continued)

(52) U.S. Cl.
CPC ............ *H01L 24/98* (2013.01); *B23K 1/0056* (2013.01); *B23K 26/0608* (2013.01);
(Continued)

(58) Field of Classification Search
CPC ......... H01L 24/98; H01L 24/13; H01L 24/16; H01L 24/799; H01L 24/81; H01L 25/0655; H01L 25/0753; H01L 22/22; H01L 2224/13111; H01L 2224/16227; H01L 2224/7999; H01L 2224/81801; H01L 2224/98; H01L 2221/68363;
(Continued)

(56) References Cited

U.S. PATENT DOCUMENTS

| 5,961,860 | A | * | 10/1999 | Lu | ......................... | B23K 26/351 |
| | | | | | | 219/121.68 |
| 7,202,141 | B2 | | 4/2007 | Park et al. | | |
| 2024/0387211 | A1 | * | 11/2024 | Chen | ..................... | B32B 43/006 |

FOREIGN PATENT DOCUMENTS

| CN | 1973375 | 5/2007 |
| CN | 110462807 | 11/2019 |

(Continued)

OTHER PUBLICATIONS

"Office Action of Taiwan Counterpart Application", issued on Jul. 18, 2023, p. 1-p. 7.
(Continued)

*Primary Examiner* — Douglas W Owens
(74) *Attorney, Agent, or Firm* — JCIPRNET

(57) ABSTRACT

A method for trimming a micro electronic element includes: providing a substrate, wherein at least one micro electronic element is disposed on the substrate, heating an interface of the substrate and the micro electronic element by a first pulse laser beam to reduce a bonding force between the micro electronic element and the substrate, and irradiating a surface layer of the micro electronic element by a second pulse laser beam to generate a shock wave due to plasma on the surface layer of the micro electronic element. The shock wave removes the micro electronic element away from the substrate. An apparatus for trimming a micro electronic element is also provided.

15 Claims, 4 Drawing Sheets

(51) Int. Cl.
  *B23K 26/06* (2014.01)
  *B23K 26/0622* (2014.01)
  *B23K 26/351* (2014.01)
  *B23K 101/36* (2006.01)
  *H01L 21/66* (2006.01)
  *H01L 25/065* (2023.01)
  *H01L 25/075* (2006.01)

(52) U.S. Cl.
  CPC ........ *B23K 26/0622* (2015.10); *B23K 26/351* (2015.10); *H01L 24/13* (2013.01); *H01L 24/16* (2013.01); *H01L 24/799* (2013.01); *H01L 24/81* (2013.01); *H01L 25/0655* (2013.01); *H01L 25/0753* (2013.01); *B23K 2101/36* (2018.08); *H01L 22/22* (2013.01); *H01L 2224/13111* (2013.01); *H01L 2224/16227* (2013.01); *H01L 2224/7999* (2013.01); *H01L 2224/81801* (2013.01); *H01L 2224/98* (2013.01)

(58) Field of Classification Search
  CPC . H01L 2221/68368; H01L 2221/68381; H01L 21/6835; B23K 1/0056; B23K 26/0608; B23K 26/0622; B23K 26/351; B23K 2101/36; B23K 26/0624
  See application file for complete search history.

(56) References Cited

FOREIGN PATENT DOCUMENTS

| | | |
|---|---|---|
| CN | 111556705 | 8/2020 |
| CN | 114551305 | 5/2022 |
| TW | 202030821 | 8/2020 |
| TW | 202211431 | 3/2022 |

OTHER PUBLICATIONS

"Office Action of China Counterpart Application", issued on Apr. 30, 2025, p. 1-p. 6.

* cited by examiner

METHOD AND APPARATUS FOR TRIMMING MICRO ELECTRONIC ELEMENT

CROSS-REFERENCE TO RELATED APPLICATION

This application claims the priority benefit of Taiwan application serial no. 111132413, filed on Aug. 29, 2022. The entirety of the above-mentioned patent application is hereby incorporated by reference herein and made a part of this specification.

BACKGROUND

Technical Field

The disclosure relates to a method and an apparatus for trimming a micro electronic element.

Description of Related Art

With the advancement of display technology, in addition to the mainstream liquid crystal displays and organic light-emitting diode displays, micro light-emitting diode displays are further developed.

A fabrication process of the micro light-emitting diode displays is usually to transfer a micro light-emitting diode to a transferred substrate after growing the micro light-emitting diode on a growth substrate, and then transfer the micro light-emitting diode from the transferred substrate to a display backplane. However, it sometimes happens that the micro light-emitting diode with poor quality are transferred to the display backplane or the transferred substrate, and the light-emitting diode with poor quality is required to be removed.

When the display backplane is a glass carrier, the light-emitting diode is usually broken by the laser, and then the fragments are blown away. When the display backplane is a printed circuit board, it is usually desoldered by heating and then pulled out with a suction pen. However, the efficiency of such practices is not high, and the energy required to break the micro light-emitting diode by the laser is large, which is easy to damage a conductive circuit of the display backplane. Similar issues arise for other micro electronic elements where a non-micro light-emitting diode is removed from the substrate.

SUMMARY

The disclosure provides a method and an apparatus for trimming a micro electronic element, which have high efficiency and may reduce damage to a substrate.

A method for trimming a micro electronic element according to an embodiment of the disclosure includes the following. A substrate is provided, and at least one micro electronic element is disposed on the substrate. An interface of the substrate and the micro electronic element is heated by a first pulse laser beam to reduce a bonding force between the micro electronic element and the substrate. A surface layer of the micro electronic element is irradiated by a second pulse laser beam to generate a shock wave due to plasma on the surface layer of the micro electronic element. The shock wave removes the micro electronic element away from the substrate.

An apparatus for trimming a micro electronic element according to an embodiment of the disclosure is adapted to trim a substrate provided with at least one micro electronic element. The apparatus for trimming the micro electronic element includes a first laser unit and a second laser unit. The first laser unit is configured to emit a first pulse laser beam to heat an interface between the substrate and the micro electronic element, so as to reduce a bonding force between the micro electronic element and the substrate. The second laser unit is configured to emit a second pulse laser beam and irradiate the second pulse laser beam on a surface layer of the micro electronic element, so as to generate a shock wave due to plasma on the surface layer of the micro electronic element. The shock wave removes the micro electronic element away from the substrate, and a pulse wave period of the second pulse laser beam is less than a pulse wave period of the first pulse laser beam.

In the method and the apparatus for trimming the micro electronic element according to the embodiments of the disclosure, the bonding force between the micro electronic element and the substrate is reduced by the first pulse laser beam, and the shock wave is generated by the second pulse laser beam to shake the micro electronic element away. Therefore, the method for trimming the micro electronic element according to the embodiments of the disclosure has the high efficiency and may shorten the working hours. In addition, since the micro electronic element is not broken by the laser, the laser energy used in the method and the apparatus for trimming the micro electronic element according to the embodiments of the disclosure is lower, and the damage to the substrate may be reduced.

DETAILED DESCRIPTION OF DISCLOSED EMBODIMENTS

Figure 1A:
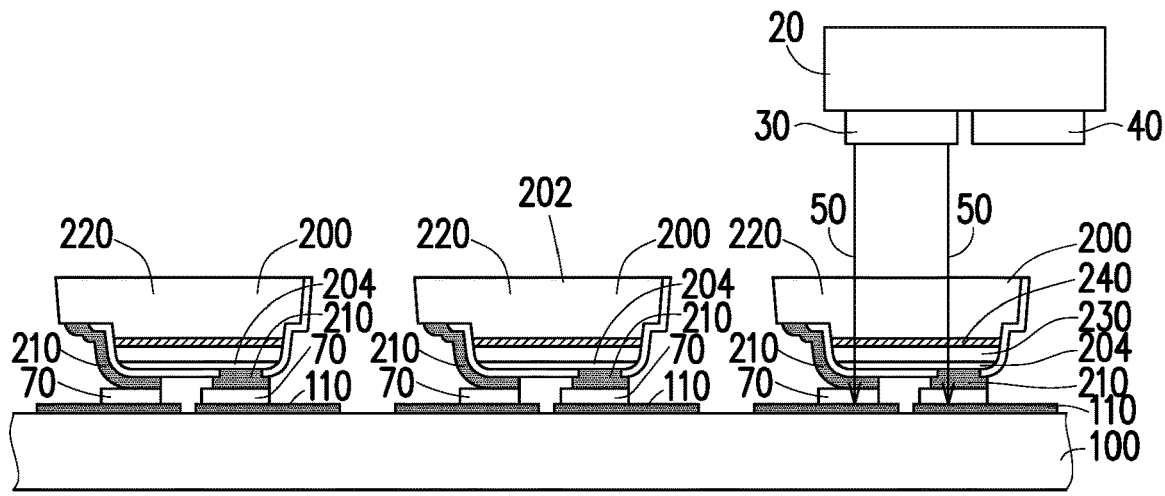
FIGS. 1A to 1C are schematic cross-sectional views of a process of a method for trimming a micro electronic element according to an embodiment of the disclosure.
Figure 1B:
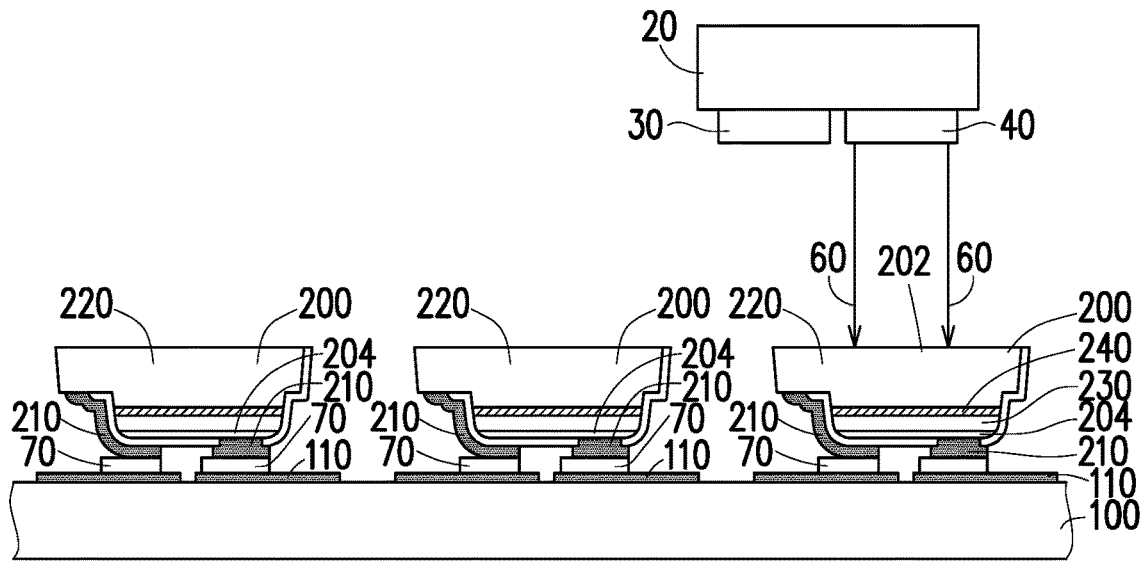
Figure 1C:
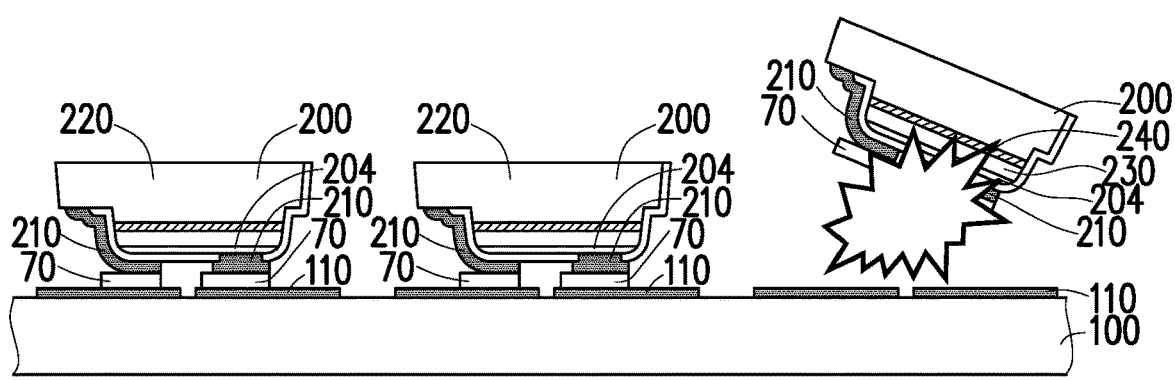

FIGS. 1A to 1C are schematic cross-sectional views of a process of a method for trimming a micro electronic element according to an embodiment of the disclosure. Referring to FIGS. 1A to 1C, the method for trimming the micro electronic element in this embodiment includes the following steps. First, as shown in FIG. 1A, a substrate 100 is provided. Multiple micro electronic elements 200 are disposed on the substrate 100, and the substrate 100 is, for example, a display backplane with multiple conductive circuits 110 thereon. The micro electronic elements 200 may be arranged in an array to form a display pixel array. In this embodiment, the micro electronic element 200 is a micro light-emitting diode (micro LED). However, in other embodiments, the micro electronic element 200 may also be other electronic elements, such as a micro integrated circuit (micro IC). In this embodiment, the micro electronic element 200 has multiple pads 210, and disposing the micro electronic element 200 on the substrate 100 is implemented by soldering the conductive circuits 110 and the pads 210 through multiple bumps 70 respectively. The bump is a low melting point material, such as tin. In addition, in this embodiment, the micro electronic element 200 includes a first-type semiconductor layer 220, a second-type semiconductor layer 230, and a light-emitting layer 240. The light-emitting layer 240 is located between the first-type semiconductor layer 220 and the second-type semiconductor layer 230. The first-type semiconductor layer 220 is electrically connected to one of the pads 210 (e.g., the pad 210 at a lower left corner of the micro electronic element 200 in FIG. 1A), and the second-type semiconductor layer 230 is electrically connected to another one of the pads 210 (e.g., the pad 210 at a lower right corner of the micro electronic element 200 in FIG. 1A). The first-type semiconductor layer 220 is, for example, an N-type semiconductor layer, and the second-type semiconductor layer 230 is, for example, a P-type semiconductor layer. However, in other embodiments, the first-type semiconductor layer 220 may be the P-type semiconductor layer, and the second-type semiconductor layer 230 may be the N-type semiconductor layer. In an embodiment that is not shown, the substrate 100 may also be a temporary transferred substrate, and the micro electronic element 200 is disposed on the substrate 100, in which the micro electronic element is disposed through multiple buffer portions that may be formed by a polymer material on the substrate.

Next, when it is detected that some of the micro electronic elements 200 on the substrate 100 (e.g., the micro electronic elements on the right in FIG. 1A) are of poor quality and are to be removed, an interface of the substrate 100 and the micro electronic element 200 to be removed is heated by a first pulse laser beam 50 to reduce a bonding force between the micro electronic element 200 and the substrate 100. That is, it is implemented by heating regions at the interface where the bumps 70, the conductive circuits 110, and the pads 210 are located. In this embodiment, heating the interface of the substrate 100 and the micro electronic element 200 by the first pulse laser beam 50 refers to heating an interface of the bumps 70 and the conductive circuits 110, so that some of the bumps 70 at the interface are melted.

In addition, as shown in FIG. 1B, when some of the bumps 70 at the interface are melted, a surface layer 202 (e.g., a semiconductor epitaxial layer close to a surface) of the micro electronic element 200 to be removed is irradiated by a second pulse laser beam 60 to generate plasma (e.g., high-density plasma) on the surface layer 202 of the micro electronic element 200, and the plasma strikes a bottom layer 204 of the micro electronic element 200 relative to the surface layer 202 to generate a shock wave. In addition, as shown in FIG. 1C, the shock wave shakes the micro electronic element 200 away, removing the micro electronic element away from the substrate 100.

Figure 2:
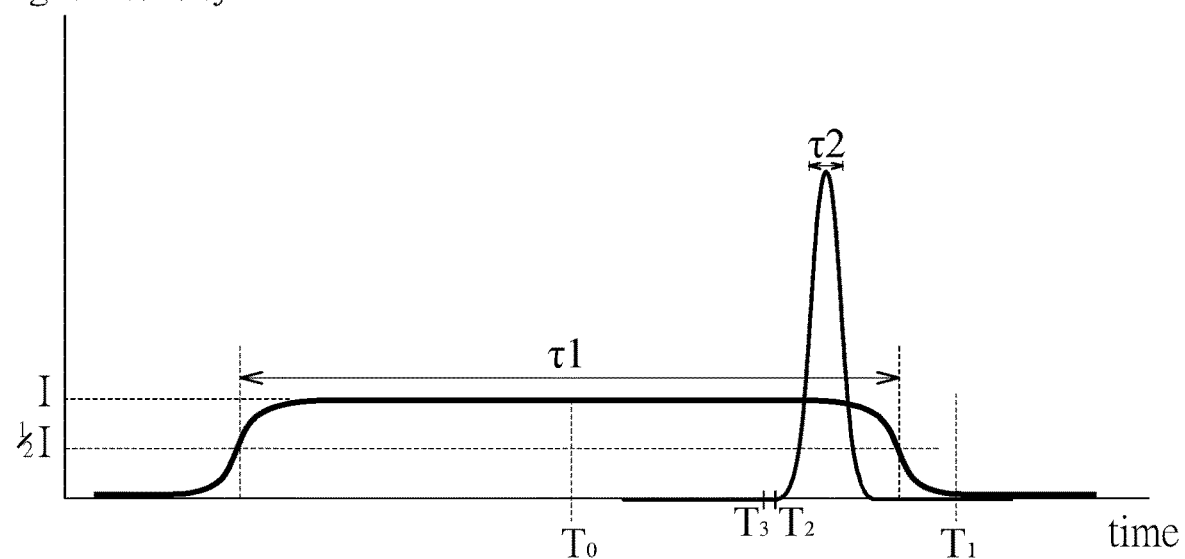
FIG. 2 is a timing chart of a first pulse laser beam and a second pulse laser beam in FIGS. 1A and 1B.

FIG. 2 is a timing chart of a first pulse laser beam and a second pulse laser beam in FIGS. 1A and 1B. Referring to FIGS. 1A to 1C and 2, in this embodiment, a pulse wave period τ2 of the second pulse laser beam 60 is less than a pulse wave period τ1 of the first pulse laser beam 50. The pulse wave period is calculated as a full width at half maximum, that is, the time that light intensity lasts for more than half of the maximum light intensity. For example, if the maximum light intensity of the pulse wave of the first pulse laser beam 50 is I, the pulse wave period τ1 of the first pulse laser beam 50 is the duration of light intensity I/2 or more. In this embodiment, the pulse wave period τ2 of the second pulse laser beam 60 falls after a second half of the pulse wave period τ1 of the first pulse laser beam 50, so that when the micro electronic element 200 is shaken away by the second pulse laser beam 60, some of the bumps 70 at the interface have sufficient time to be heated by the first pulse laser beam 50 to be in a molten state, so that the micro electronic element 200 is more likely to be shaken away. More specifically, the pulse wave period τ2 of the second pulse laser beam 60 falls within the second half of the pulse wave period τ1 of the first pulse laser beam 50, and a start time T2 of the second pulse laser beam 60 falls after a midpoint time 13 between a midpoint time $T_0$ of the pulse wave period τ1 of the first pulse laser beam 50 and an end time $T_1$ of the first pulse laser beam 50, where T3=(T0+T1)/2. That is to say, the time point $T_1$ is the time when the bump 70 starts to cool down, and a better start time for the second pulse laser beam 60 is at the end of the time when the first pulse laser beam 50 exists. In this embodiment, a ratio of the pulse wave period τ1 of the first pulse laser beam 50 to the pulse wave period τ2 of the second pulse laser beam 60 is greater than or equal to $10^6$. Here, an order of magnitude of the pulse wave period τ1 of the first pulse laser beam 50 is in an order of μs, that is, about $10^{-6}$ seconds, and an order of magnitude of the pulse wave period τ2 of the second pulse laser beam 60 is in an order of ps, that is, that is, $10^{-12}$ seconds. In this embodiment, a wavelength of the second pulse laser beam 60 is less than a wavelength of the first pulse laser beam 50. In an embodiment, a ratio of the wavelength of the second pulse laser beam 60 to the wavelength of the first pulse laser beam 50 is greater than 0.3. For example, the wavelength of the first pulse laser beam 50 is, for example, 1064 nanometers (nm), and the first pulse laser beam 50 is infrared light, which is easily absorbed by the material of the bump 70. In addition, a wavelength range of the second pulse laser beam 60 is, for example, 150 nm to 355 nm. The second pulse laser beam 60 is ultraviolet light, which is easily absorbed by the semiconductor layer of the micro electronic element 200, so that the second pulse laser beam 60 may not be easily irradiated to the conductive circuit 110 below the micro electronic element 200 to damage the conductive circuit 110.

The method for trimming the micro electronic element in FIGS. 1A to 1C may be performed by an apparatus 20 for trimming a micro electronic element in this embodiment. The apparatus 20 for trimming the micro electronic element is adapted to trim the substrate 100 provided with at least one micro electronic element 200. The apparatus 20 for trimming the micro electronic element includes a first laser unit 30 and a second laser unit 40. The first laser unit 30 is configured to emit the first pulse laser beam 50 to heat the interface of the substrate 100 and the micro electronic element 200 to be removed, so as to reduce the bonding force between the micro electronic element 200 and the substrate 100. The second laser unit 40 is configured to emit the second pulse laser beam 60 and irradiate the second pulse laser beam 60 on the surface layer 202 of the micro electronic element 200, so as to generate the shock wave due to the plasma on the surface layer 202 of the micro electronic element 200. The shock wave removes the micro electronic element 200 away from the substrate 100. The pulse wave period τ2 of the second pulse laser beam 60 is less than the pulse wave period τ1 of the first pulse laser beam 50. For other details of the first pulse laser beam 50 and the second pulse laser beam 60, reference may be made to the descriptions of the embodiments of FIGS. 1A to 1C and 2, and thus the same details will not be repeated in the following.

In this embodiment, the first laser unit 30 and the second laser unit 40 may be various types of laser transmitters. In addition, the apparatus 20 for trimming the micro electronic element may further include a controller electrically connected to the first laser unit 30 and the second laser unit 40 to control the light-emitting timing, lighting intensity, and actuation of the first laser unit 30 and the second laser unit 40.

Figure 3:
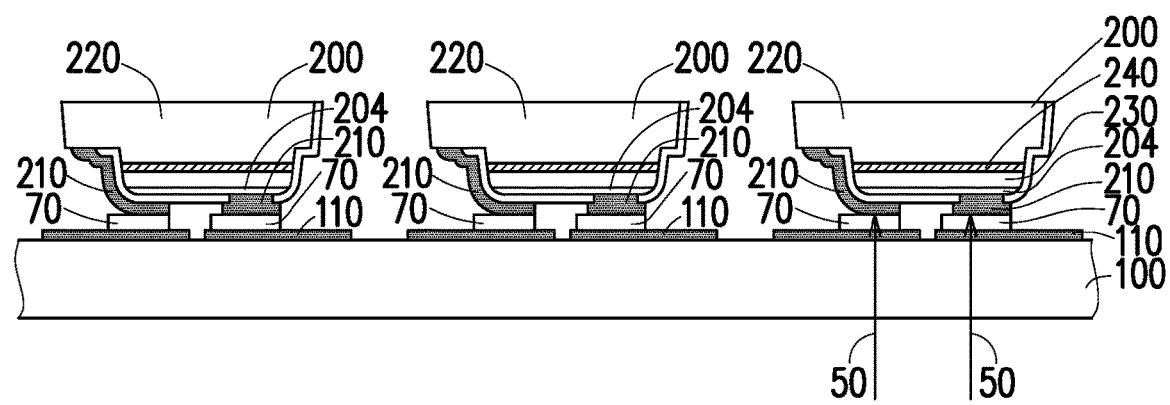
FIG. 3 is a schematic cross-sectional view of another variation of the embodiment of FIG. 1A.

In this embodiment, both the first pulse laser beam 50 and the second pulse laser beam 60 are irradiated from a side of the micro electronic element 200 away from the substrate 100 (i.e., irradiated from the top to the bottom in FIGS. 1A and 1B). However, in another embodiment, the first pulse laser beam 50 is irradiated from a side of the substrate 100 away from the micro electronic element 200 (as shown in FIG. 3, irradiated from the bottom to the top in FIG. 3), and the second pulse laser beam 60 is irradiated from the side of the micro electronic element 200 away from the substrate 100 (i.e., irradiated from the top to the bottom in FIG. 1B), so that the interface of the substrate 100 and the micro electronic element may heated faster to reduce the bonding force between the micro electronic element 200 and the substrate 100 faster.

Figure 4A:
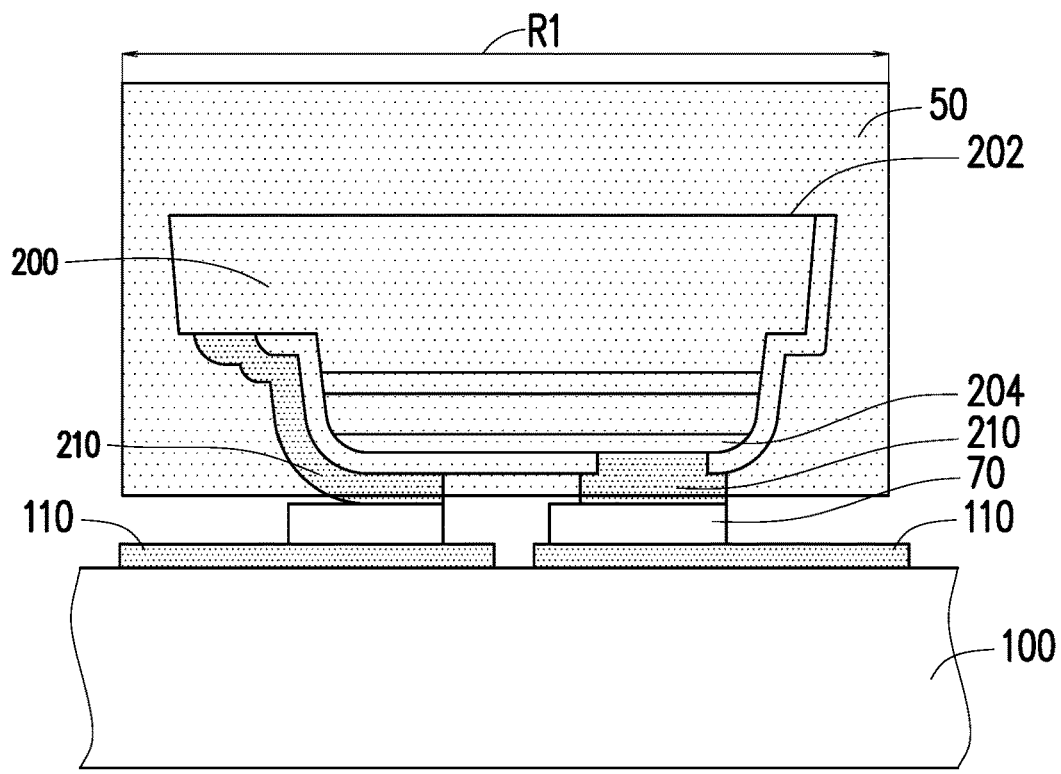
FIGS. 4A and 4B respectively illustrate coverages of the first pulse laser beam and the second pulse laser beam in FIGS. 1A and 1B.
Figure 4B:
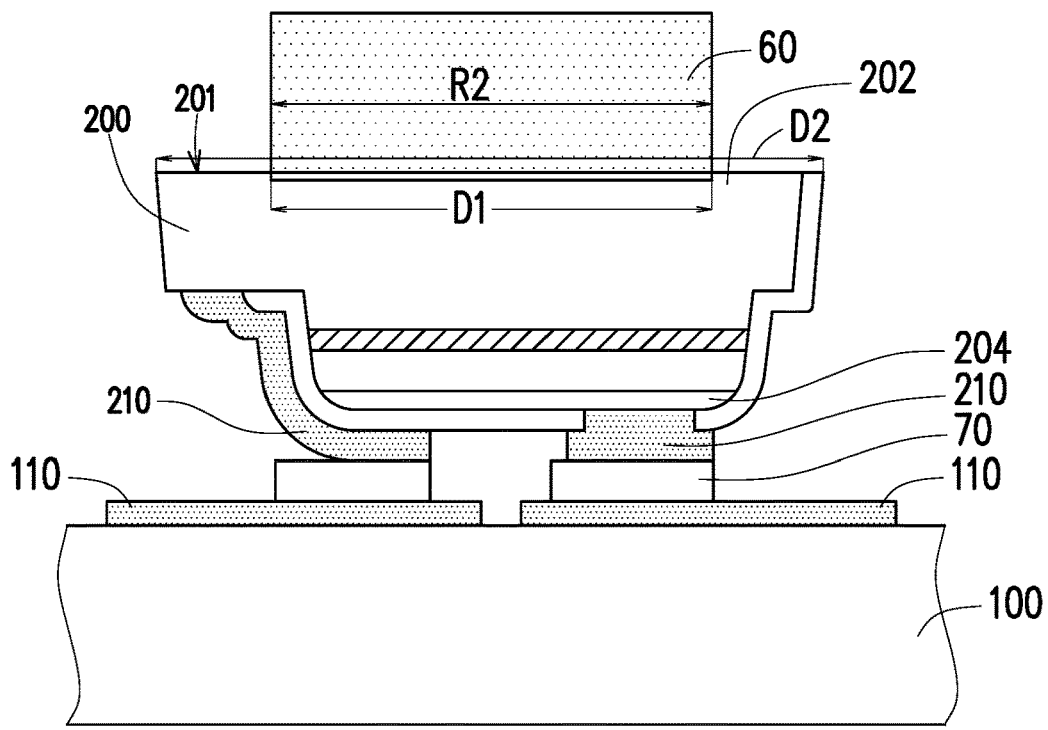

FIGS. 4A and 4B respectively illustrate coverages of the first pulse laser beam and the second pulse laser beam in FIGS. 1A and 1B. Referring to FIGS. 1A, 1B, 4A, and 4B, in this embodiment, an irradiation range R2 of the second pulse laser beam 60 is less than an irradiation range R1 of the first pulse laser beam 50. In addition, in this embodiment, the irradiation range R2 of the second pulse laser beam 60 on a top surface 201 of the micro electronic element 200 overlaps and is less than or equal to an area of the top surface 201 of the micro electronic element 200. In an embodiment, a spot diameter D1 of the second pulse laser beam 60 irradiated on the micro electronic element 200 is less than a minimum side length D2 of the micro electronic element 200 (if the top surface 201 of the micro electronic element 200 is a rectangle or is similar to the rectangle in a top view, the minimum side length D2 is a short side of the rectangle). In addition, the spot diameter D1 is defined as a diameter of a range in which light intensity of a spot is $1/e^2$ or more of the maximum light intensity, where e is a natural base. A design that the irradiation scope R2 of the second pulse laser beam 60 on the top surface 201 of the micro electronic element 200 overlaps and is less than or equal to the area of the top surface 201 of the micro electronic element 200 may enable the second pulse laser beam 60 to be irradiated on a surface of the micro electronic element 200 to ensure that the shock wave of the laser plasma may effectively exert force on the micro electronic element 200, and may enable the micro electronic element 200 to block the second pulse laser beam 60 without causing the substrate 100 and the conductive circuit 110 thereon to be damaged by the second pulse laser beam 60.

In addition, in this embodiment, heating the interface of the substrate 100 and the micro electronic element 200 by the first pulse laser beam 50 refers to irradiating the first pulse laser beam 50 on the interface of the substrate 100 and the micro electronic element 200 to heat the interface. However, in another embodiment, heating the interface of the substrate 100 and the micro electronic element 200 by the first pulse laser beam 50 may also refer to irradiating the first pulse laser beam 50 on the substrate 100 or the micro electronic element 200 to generate heat energy, and the heat energy is transferred to the interface of the substrate 100 and the micro electronic element 200 through heat conduction.

In the method for trimming the micro electronic element in this embodiment, the bonding force between the micro electronic element 200 and the substrate 100 is reduced by the first pulse laser beam 50 (the step may be referred to as a thermal process), and the shock wave is generated by the second pulse laser beam 60 to shake the micro electronic element 200 away (the step may be referred to as an ablation process). Therefore, the method for trimming the micro electronic element in this embodiment has high efficiency and may shorten working hours. In addition, since the micro electronic element 200 is not broken by the laser, laser energy used in the method for trimming the micro electronic element in this embodiment is lower, and the damage to the substrate 100 may be reduced.

Figure 5:
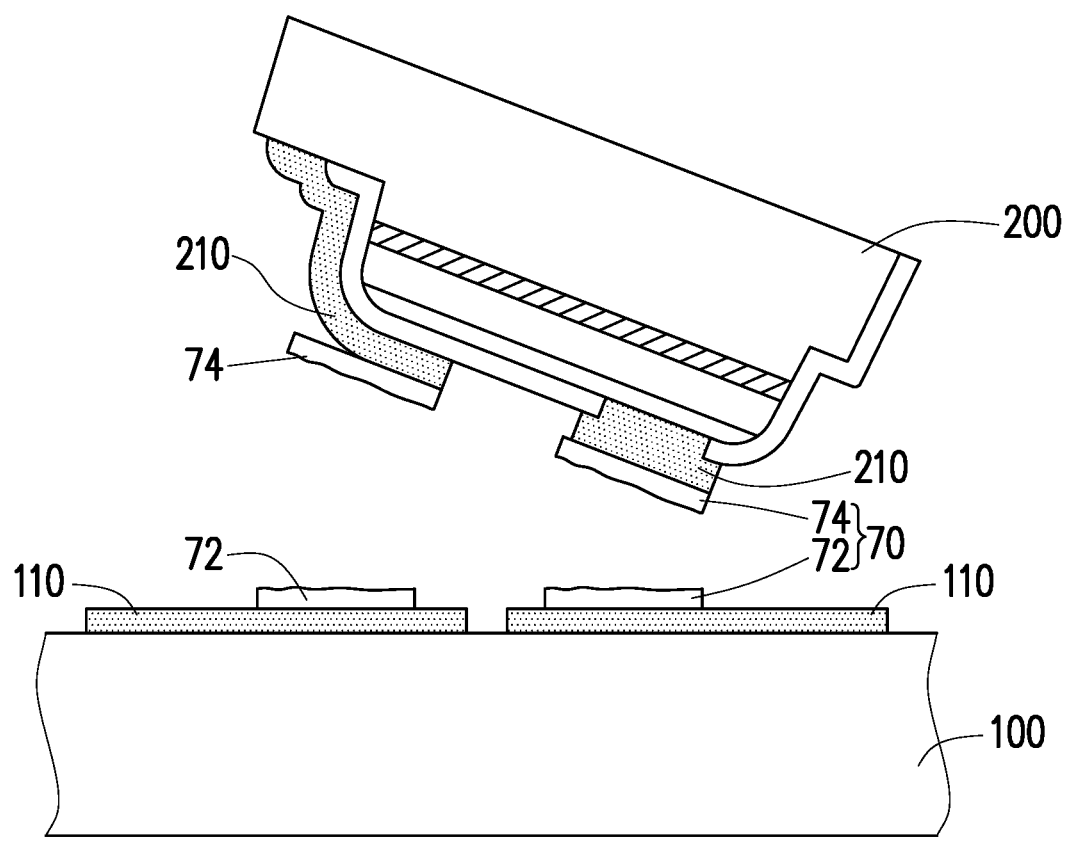
FIG. 5 is a schematic cross-sectional view of another variation of the embodiment of FIG. 1C.

FIG. 5 is a schematic cross-sectional view of another variation of the embodiment of FIG. 1C. Referring to FIGS. 1B and 5, in the embodiment of 1C, after the micro electronic element 200 is shaken away by the second pulse laser beam 60, the bump 70 is shaken away along with the micro electronic element 200. However, in the embodiment of FIG. 5, the bump 70 may be split into two portions after the micro electronic element 200 is shaken away by the second pulse laser beam 60. An upper portion 74 of the bump 70 is shaken away along with the micro electronic element 200, while a lower portion 72 of the bump 70 is left on the conductive circuit 110. That is, at least a portion of the bump 70 is left on the substrate 100 after being separated from the substrate 100 along with the micro electronic element 200. The lower portion 72 of the bump 70 left on the conductive circuit 110 helps to bond the micro electronic element 200 with good quality on the lower portion 72 of the bump 70 after the micro electronic element 200 with poor quality is shaken away.

In addition, in the embodiment of FIGS. 1A to 1C and 5, a method for confirming parameters of the first pulse laser beam 50 is as follows. The parameters may be adjusted to laser peak power and a pulse length. Heat radiation generated by the melting of the bump 70 may be used as an intermediate product, and then intensity of a thermal emission spectrometer may be measured by a spectrometer as optimization of scanning of two-dimensional parameters (in which the parameters are, for example, the power and pulse wave period). In addition, during a process of scanning of the two-dimensional parameters, a high-pressure gas may be directly used to act on the target micro electronic element 200 synchronously.

In addition, after the parameters of the first pulse laser beam 50 are confirmed, scanning of parameters of the second pulse laser beam 60 to remove the micro electronic element 200 may be performed. If a fixed pulse length is used, the adjustable parameter is the pulse energy (single shot). In addition, the spot diameter should be less than or equal to the minimum side length of the micro electronic element 200 as much as possible.

After the parameters of the first pulse laser beam 50 and the second pulse laser beam 60 are confirmed, the next parameter to be adjusted is a time difference between the two pulses. In addition, a relational formula between a volume of the bump 70 and the laser energy is (X+Y)/A. It takes X joules to heat the bump 70 to a target temperature. An absorption rate of the laser to the material is A (in which deducting reflection and penetration, the value is less than 1). Energy lost in a heating process is Y (loss of heat conduction, convection, radiation, etc.). Then, the actual laser energy output to the micro electronic element 200 to be removed is (X+Y)/A. After the volume and density of bump 70 is confirmed, a weight may be calculated. Neat, after heat capacity thereof and an expected temperature rise are confirmed, it is possible to calculate how much energy (set to X joules) is required to be absorbed to heat the bump 70 to the target temperature.

On the other hand, a relational formula of shaking the micro electronic element 200 away is S×P>2 times a weight of the micro electronic element 200. A spot size of the second pulse laser beam 60 is S, and pressure of the shock wave received by the micro electronic element 200 is P.

Based on the above, in the method and the apparatus for trimming the micro electronic element according to the embodiments of the disclosure, the bonding force between the micro electronic element and the substrate is reduced by the first pulse laser beam, and the shock wave is generated by the second pulse laser beam to shake the micro electronic element away. Therefore, the method for trimming the micro electronic element according to the embodiments of the disclosure has the high efficiency and may shorten the working hours. In addition, since the micro electronic element is not broken by the laser, the laser energy used in the method and the apparatus for trimming the micro electronic element according to the embodiments of the disclosure is lower, and the damage to the substrate may be reduced.

What is claimed is:

1. A method for trimming a micro electronic element, comprising:
providing a substrate, wherein at least one micro electronic element is disposed on the substrate;
heating an interface of the substrate and the micro electronic element by a first pulse laser beam to reduce a bonding force between the micro electronic element and the substrate; and
irradiating a surface layer of the micro electronic element by a second pulse laser beam to generate a shock wave due to plasma on the surface layer of the micro electronic element, wherein the shock wave removes the micro electronic element away from the substrate.

2. The method for trimming the micro electronic element according to claim 1, wherein a pulse wave period of the second pulse laser beam is less than a pulse wave period of the first pulse laser beam.

3. The method for trimming the micro electronic element according to claim 2, wherein a ratio of the pulse wave period of the first pulse laser beam to the pulse wave period of the second pulse laser beam is greater than or equal to $10^6$.

4. The method for trimming the micro electronic element according to claim 2, wherein the pulse wave period of the second pulse laser beam falls after a second half of the pulse wave period of the first pulse laser beam.

5. The method for trimming the micro electronic element according to claim 4, wherein a start time of the second pulse laser beam falls after a midpoint time between a midpoint time of the pulse wave period of the first pulse laser beam and an end time of the first pulse laser beam.

6. The method for trimming the micro electronic element according to claim 1, wherein a ratio of a wavelength of the second pulse laser beam to a wavelength of the first pulse laser beam is greater than 0.3.

7. The method for trimming the micro electronic element according to claim 1, wherein an irradiation range of the second pulse laser beam is less than an irradiation range of the first pulse laser beam.

8. The method for trimming the micro electronic element according to claim 1, wherein a spot diameter of the second pulse laser beam irradiated on the micro electronic element is less than a minimum side length of the micro electronic element.

9. The method for trimming the micro electronic element according to claim 8, wherein an irradiation range of the second pulse laser beam on a top surface of the micro electronic element overlaps and is less than or equal to an area of the top surface of the micro electronic element.

10. The method for trimming the micro electronic element according to claim 1, wherein the substrate has a plurality of conductive circuits, the micro electronic element has a plurality of pads, and disposing the micro electronic element on the substrate is implemented by soldering the conductive circuits and the pads through a plurality of bumps respectively.

11. The method for trimming the micro electronic element according to claim 10, wherein at least a portion of the bump is left on the substrate after being separated from the substrate along with the micro electronic element.

12. The method for trimming the micro electronic element according to claim 10, wherein heating the interface of the substrate and the micro electronic element by the first pulse laser beam refers to heating an interface of the bumps and the conductive circuits, so that some of the bumps at the interface are melted.

13. The method for trimming the micro electronic element according to claim 1, wherein heating the interface of the substrate and the micro electronic element by the first pulse laser beam refers to irradiating the first pulse laser beam on the substrate or the micro electronic element to generate heat energy, and the heat energy is transferred to the interface of the substrate and the micro electronic element through heat conduction.

14. The method for trimming the micro electronic element according to claim 1, wherein both the first pulse laser beam and the second pulse laser beam are irradiated from a side of the micro electronic element away from the substrate.

15. The method for trimming the micro electronic element according to claim 1, wherein the first pulse laser beam is irradiated from a side of the substrate away from the micro electronic element, and the second pulse laser beam is irradiated from a side of the micro electronic element away from the substrate.

* * * * *